United States Patent
Ha

(10) Patent No.: US 6,510,084 B2
(45) Date of Patent: Jan. 21, 2003

(54) COLUMN DECODER WITH INCREASED IMMUNITY TO HIGH VOLTAGE BREAKDOWN

(75) Inventor: Chang Wan Ha, Pleasanton, CA (US)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 09/862,277

(22) Filed: May 21, 2001

(65) Prior Publication Data

US 2002/0172077 A1 Nov. 21, 2002

(51) Int. Cl.⁷ .......................... G11C 16/06; G11C 16/04
(52) U.S. Cl. .............................. 365/185.25; 365/185.29
(58) Field of Search ........................ 365/185.25, 185.29

(56) References Cited

U.S. PATENT DOCUMENTS

| | | | | | |
|---|---|---|---|---|---|
| 5,402,382 A | * | 3/1995 | Miyawaki et al. | ..... | 365/185.29 |
| 5,521,866 A | * | 5/1996 | Akaogi | ................... | 365/185.29 |
| 5,617,359 A | * | 4/1997 | Ninomiya | .............. | 365/185.29 |
| 5,719,807 A | * | 2/1998 | Sali et al. | .............. | 365/185.29 |
| 5,862,079 A | * | 1/1999 | Jinbo | .................... | 365/185.29 |

* cited by examiner

*Primary Examiner*—Trong Phan
(74) *Attorney, Agent, or Firm*—Townsend and Townsend and Crew LLP

(57) ABSTRACT

A column decoder in an electrically-erasable, programmable read-only memory applies a bias voltage to, or floats, the gates of selected transistors during an erasure operation. This reduces the potential for gate oxide breakdown by decreasing the voltage difference between the gate and the relatively high erasure voltage. This allows the use of transistors having a thinner gate oxide, enabling easier laying out of the transistors within a given bit line pitch.

14 Claims, 6 Drawing Sheets

COLUMN DECODER WITH INCREASED IMMUNITY TO HIGH VOLTAGE BREAKDOWN

BACKGROUND OF THE INVENTION

The present invention relates to electrically-erasable, programmable read-only memories (EEPROMs). In particular, the present invention relates to column decoders with improved resistance to gate oxide breakdown.

FIG. 1 is a circuit diagram of a conventional EEPROM 50. Bit lines 52 (columns) run vertically, and word lines 54 (rows) run horizontally. Connecting the bit lines 52 and the word lines 54 are cell transistors 56. The cell transistors 56 act as memories to store the data bits desired to be held by the EEPROM 50. A common source 58 connects the cell transistors 56. The ellipsis (three dots) in the figure represent additional rows and columns that are not illustrated. In an exemplary embodiment, the EEPROM 50 contains 16 bit lines.

Bit line discharge transistors 60 function to discharge a selected bit line. Each gate of the bit line discharge transistors 60 is coupled to a corresponding one of the column decoder circuits 70 (see FIG. 2).

Bit line selection transistors 62 function to select one of the bit lines. Each gate of the bit line selection transistors 62 is coupled to a corresponding one of the column decoder circuits 70 (see FIG. 2). In general, the bit line discharge transistor 60a and bit line selection transistor 62a associated with a given bit line 52a are coupled to one column decoder circuit, while those of another bit line are coupled to another column decoder circuit.

Selection transistors 64 function to further select a desired bit line. For example, two bit line selection transistors 62 may be controlled by the same column decoder circuit 70. In such a case, the selection transistors 64 further select the one desired bit line. In an exemplary embodiment, each selection transistor 64 is associated with eight of the bit lines 52.

FIG. 2 is a circuit diagram of a conventional column decoder circuit 70. A NAND gate 72 couples inputs (A0, A1, A2) 74 through NOT gate 76 to NAND gate 78, and a NOR gate 80 couples chip enable signal (CEB) 82 and erase signal (ERASE) 84 to the NAND gate 78. The output of the NAND gate 78 is coupled to transistor 86a, and to 86b through a NOT gate 88. The remaining transistors 90 are coupled to provide either a voltage of VPP or a ground connection to the column decoder output 92, as determined by the signal output from the NAND gate 78. The column decoder output 92 is coupled to the gates of transistors 60 and 62 (see FIG. 1) as appropriate.

In an exemplary embodiment, with 16 bit lines organized into two sets of eight bit lines, the column decoder circuits 70 associated with the transistors 60 and 62 have three inputs 74 (to select one of the eight bit lines in each set), and the column decoder circuits 70 associated with the transistors 64 have one input 74 (to select one of the two sets).

In a read operation, an appropriate one of the word lines 54 charges the gates of the associated cell transistors 56 to between about 2 and 5 volts. This selects the appropriate row. A desired one of the bit lines 52 is selected with the bit line selection transistors 62 (as controlled by the column decoder circuits 70) and the selection transistors 64. This selects the appropriate column. The common source 58 is at 0 volts and the selected bit line is between about 0.8 and 1 volts. An output of between about 3 and 4 volts is then detected by the sense amplifier (not shown).

In a write operation, the desired word line 54 is raised to a potential of between about 7 and 9 volts, the selected bit line 52 is between about 3 and 5 volts, and the common source 58 is at 0 volts. The transistors 60, 62 and 64 coupled to the selected bit line 52 are at between about 7 and 9 volts.

Of course, an important feature of EEPROMs is their erasability. The problems involved in such an erasure operation are discussed below.

FIG. 3 is a cross-sectional view of a portion of EEPROM 50 (see FIG. 1), generally formed on a P-substrate 94. Each of the cell transistors 56 is formed with a deep N-well 96 and a P-well 98. During an erasure operation, the gate of the cell transistor 56 is set to a potential level of −VPP (generally −10 volts) by the word line 54, the source of the cell transistor 56 is set to float from the source line 58, and the drain of the cell transistor 56 is set to float via the bit line 52. Generally the float potential is between 9.3 and 9.5 volts due to a diode drop. The other regions of the cell transistor 56 are set to a potential level of +VPP (generally +10 volts less the junction built-in voltage of 0.7 volts) as shown in FIG. 3. The gates of the bit line discharging transistor 60 and bit line selection transistor 62 are set to a potential level of 0 volts via output 92 of column decoder circuit 70 (see FIG. 2).

In such a case, with the gates of the transistors 60 and 62 at zero volts, and the bit line 52 setting their drains to float at approximately 9.5 volts, there is a potential for gate oxide breakdown due to the voltage differential. To overcome this problem, conventionally, high-voltage transistors are used for the transistors 60 and 62. These high-voltage transistors have a thick gate oxide and have a correspondingly large channel length. These high-voltage transistors 60 and 62 are represented in FIG. 1 by the thickly-illustrated gates. However, because of the thick gate oxide, it becomes difficult to lay out these transistors in the allotted bit line pitch.

SUMMARY OF THE INVENTION

To overcome the above-noted problems, the present invention proposes two options. The first is to provide a bias voltage to the gates of the bit line selection and discharging transistors during the erasure operation. The second is to float the gates of the bit line selection and discharging transistors during the erasure operation.

DESCRIPTION OF THE SPECIFIC EMBODIMENTS

Figure 1:
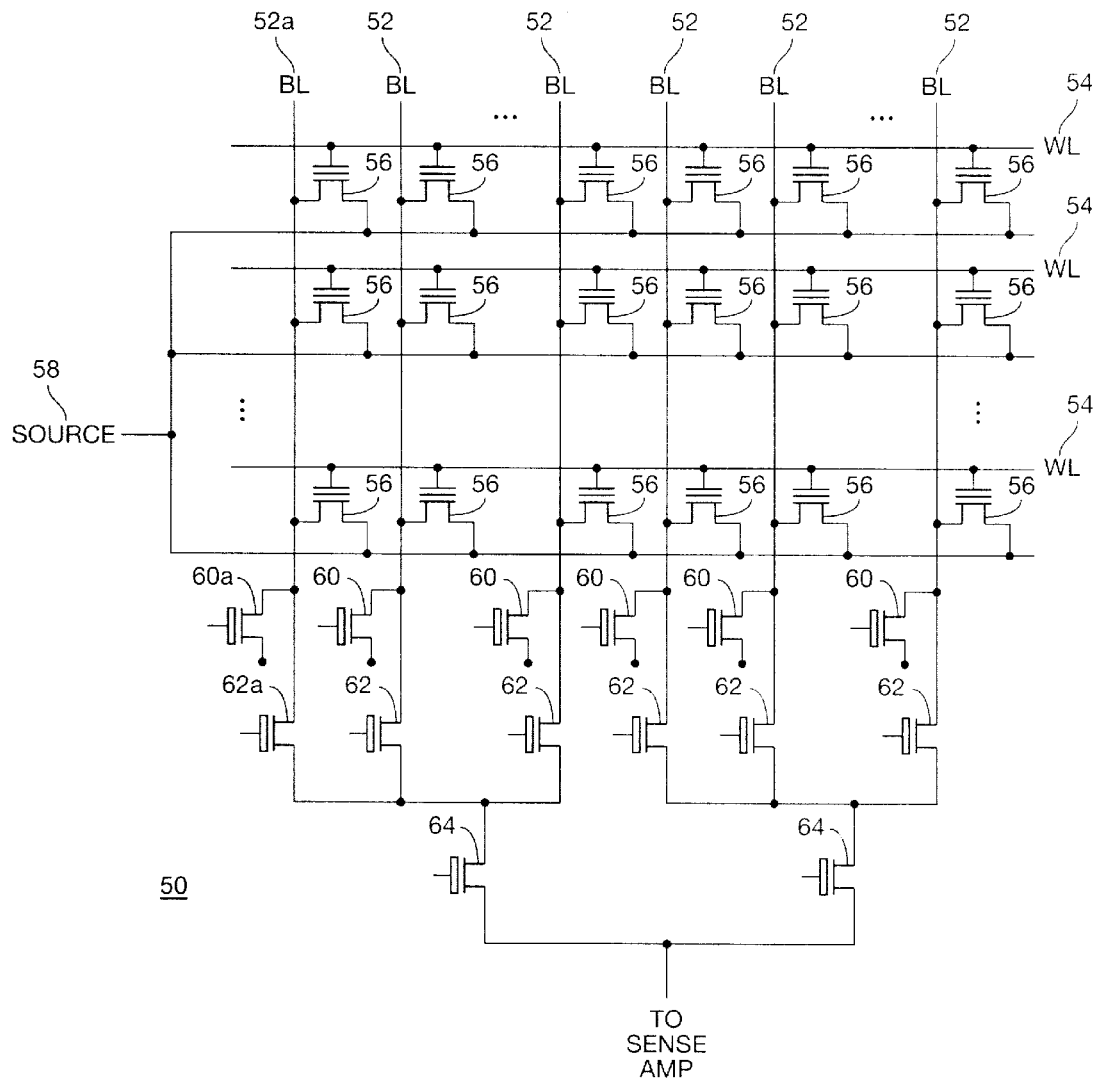
FIG. 1 is a circuit diagram of a conventional EEPROM.
Figure 2:
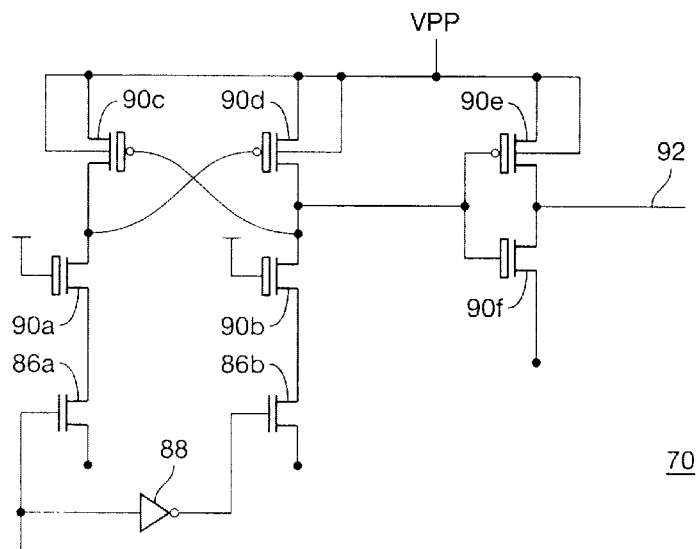
FIG. 2 is a circuit diagram of a conventional column decoder circuit.
Figure 2:
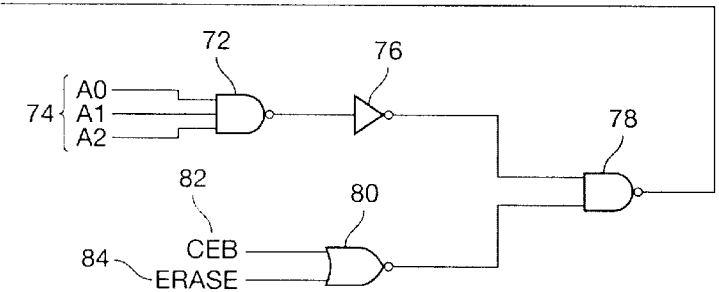
Figure 4:
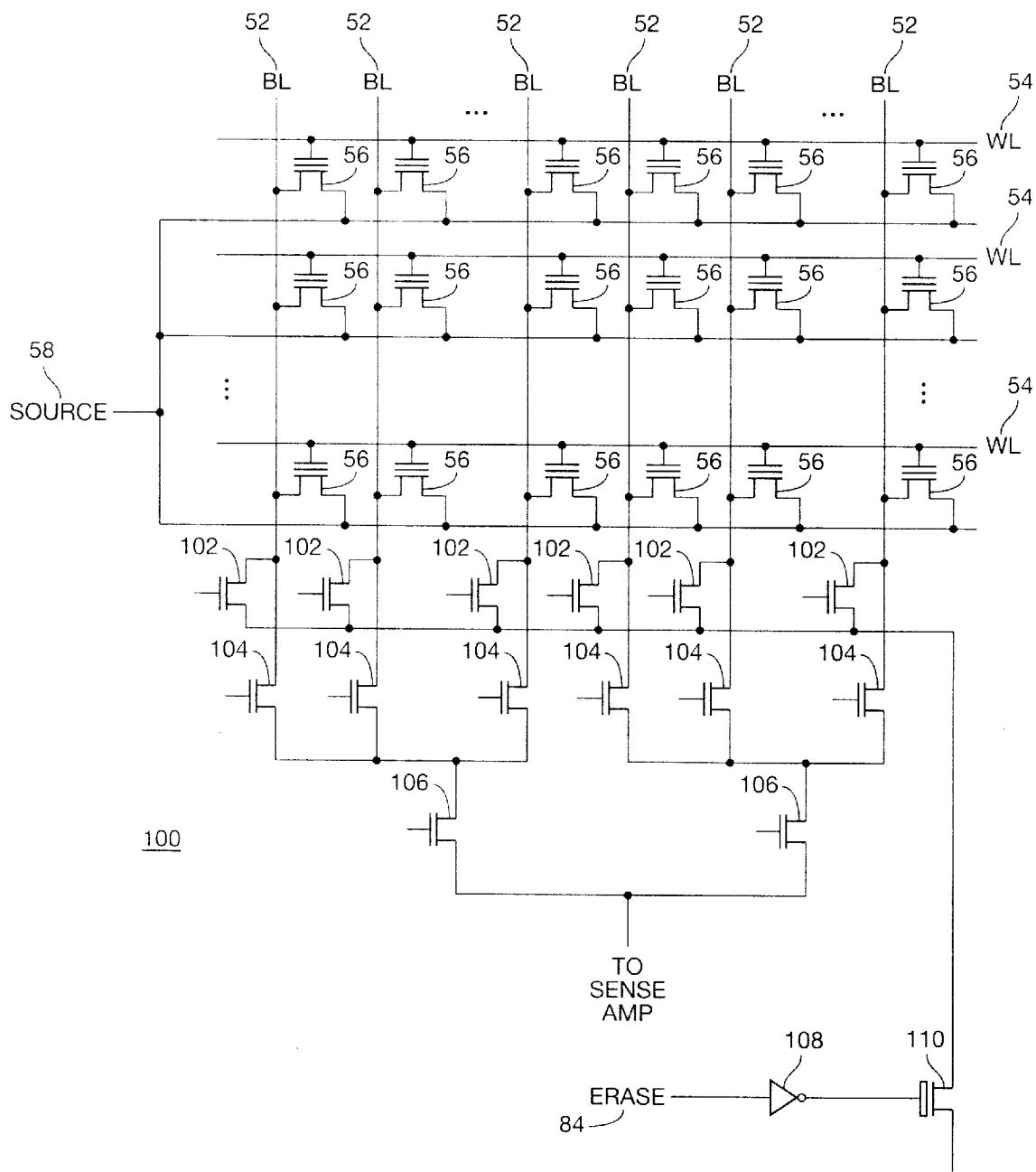
FIG. 4 is a circuit diagram of an EEPROM according to an embodiment of the present invention.

FIG. 4 is a circuit diagram of an EEPROM 100 according to an embodiment of the present invention. Components that are preferably unchanged from EEPROM 50 (see FIG. 1) have the same numbers and functions and are not further detailed. Bit line discharging transistors 102 are illustrated with a thinner gate oxide. The bit line discharging transistors are coupled to ground via transistor 110. The transistor 110 is controlled by the erase signal 84 (see FIG. 5) through NOT gate 108. The transistor 110 prevents the bit lines 52 from shorting to ground during a channel erase.

Bit line selection transistors 104 are also shown having the thinner gate oxide, as are selection transistors 106. The thinner gate oxide gives the transistors 102, 104 and 106 a smaller channel length, which allows them to more easily fit within the allotted bit line pitch. Only the transistor 110 has a thicker gate oxide.

Figure 5:
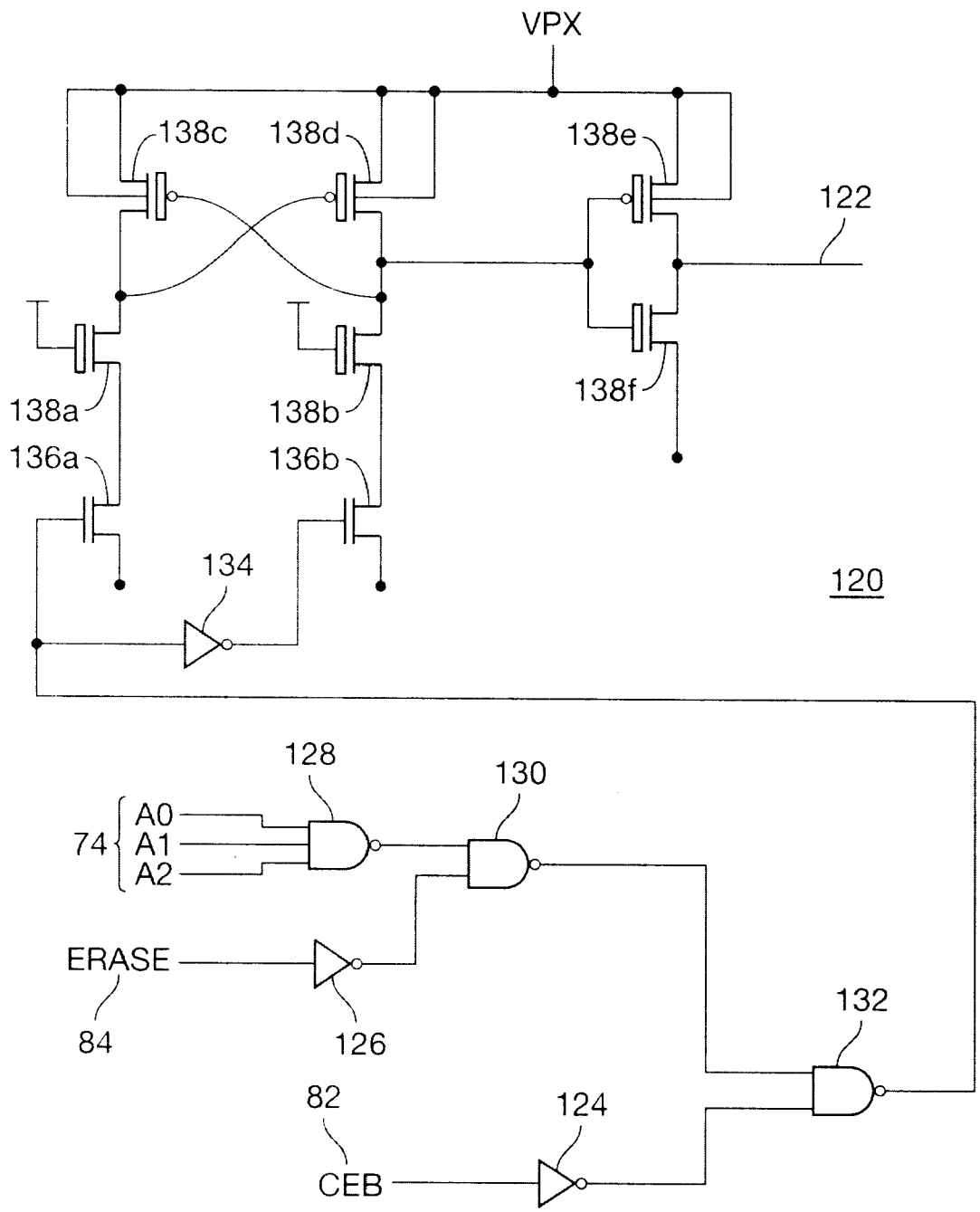
FIG. 5 is a circuit diagram of a column decoder circuit according to one embodiment of the present invention.

FIG. 5 shows a column decoder circuit 120 according to one embodiment of the present invention that enables use of the transistors 102, 104 and 106 having the thinner gate oxide. The column decoder circuit 120 enables this by applying a bias voltage VPX (which may be approximately between 3 and 5 volts) at its output 122 during an erasure operation. As the erasure voltage VPP may be about 10 volts, the bias voltage VPX may be approximately half that. Thus, when the output 122 applies the bias voltage VPX to the gates of the transistors 102, 104 and 106 (see FIG. 4) during the erasure operation, the smaller voltage difference will not cause the gate oxide to break down, even though it is thinner.

In the column decoder circuit 120, a NAND gate 128 couples the inputs (A0, A1, A2) 74, and a NOT gate 126 couples the erase signal (ERASE) 84, to a NAND gate 130. The output of the NAND gate 130, and the chip enable bar signal (CEB) 82 coupled through a NOT gate 124, are coupled to a NAND gate 132. The output of the NAND gate 132 is coupled to transistor 136a, and to transistor 136b through a NOT gate 134. The remaining transistors 138a–138f are coupled to provide either a voltage of VPX or a ground connection to the column decoder output 122, as determined by the signal output from the NAND gate 132.

Figure 6:
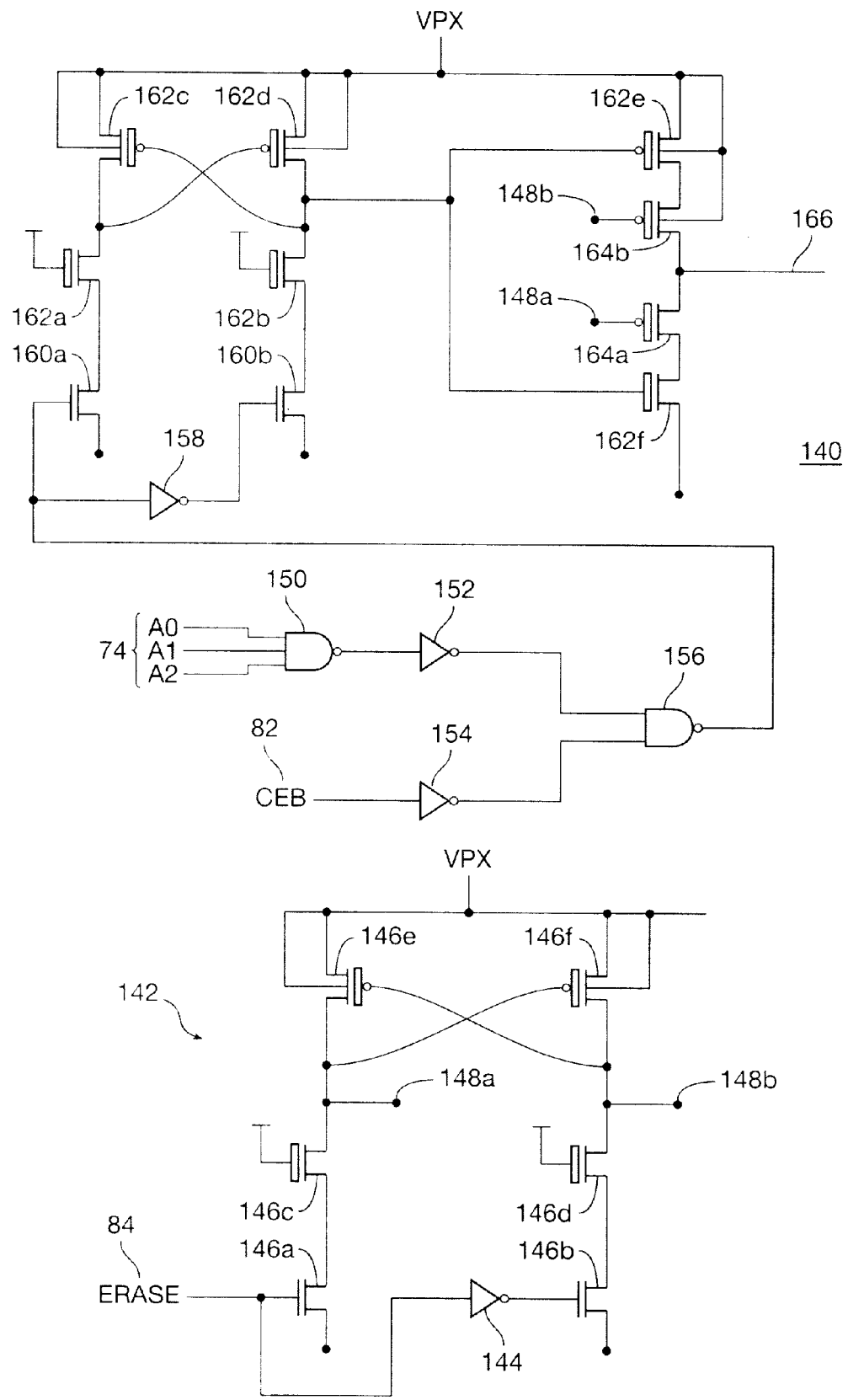
FIG. 6 is a circuit diagram of a column decoder circuit according to another embodiment of the present invention.

FIG. 6 shows a column decoder circuit 140 according to another embodiment of the present invention that enables use of the transistors 102, 104 and 106 having the thinner gate oxide. The column decoder circuit 140 includes a float control subcircuit 142. The float control subcircuit 142 includes a NOT gate 144 and six transistors 146a–146f. The float control subcircuit 142 receives as an input the erase signal (ERASE) 84. The NOT gate 144 and transistors 146 are coupled to generate outputs 148a and 148b based on the erase signal 84.

Outputs 148a and 148b are coupled to transistors 164a and 164b in the column decoder circuit 140. In the column decoder circuit 140, a NAND gate 150 and a NOT gate 152 couple the inputs (A0, A1, A2) 74 to a NAND gate 156. A NOT gate 154 couples the chip enable bar signal (CEB) 82 to the NAND gate 156. The output of the NAND gate 156 is coupled to a transistor 160a, and to a transistor 160b through a NOT gate 158. Transistors 162a–162f are coupled to provide either a voltage of VPX or a ground connection to the column decoder output 166, as determined by the signal output from the NAND gate 156. The transistors 164a–164b can be turned off by the signals 148a and 148b from the float control subcircuit 142, causing the column decoder output 166 to float during an erasure operation. The float voltage may be approximately between 9.3 and 9.5 volts (VPP of 10 volts less diode drop of about 0.7 volts), and the erasure voltage VPP may be about 10 volts. (In other variations of this embodiment, the float voltage may be approximately between 7 and 8 volts.) Thus, when the output 166 is applied to the gates of the transistors 102, 104 and 106 (see FIG. 4), the smaller voltage difference will not cause the gate oxide to break down, even though it is thinner.

Figure 3:
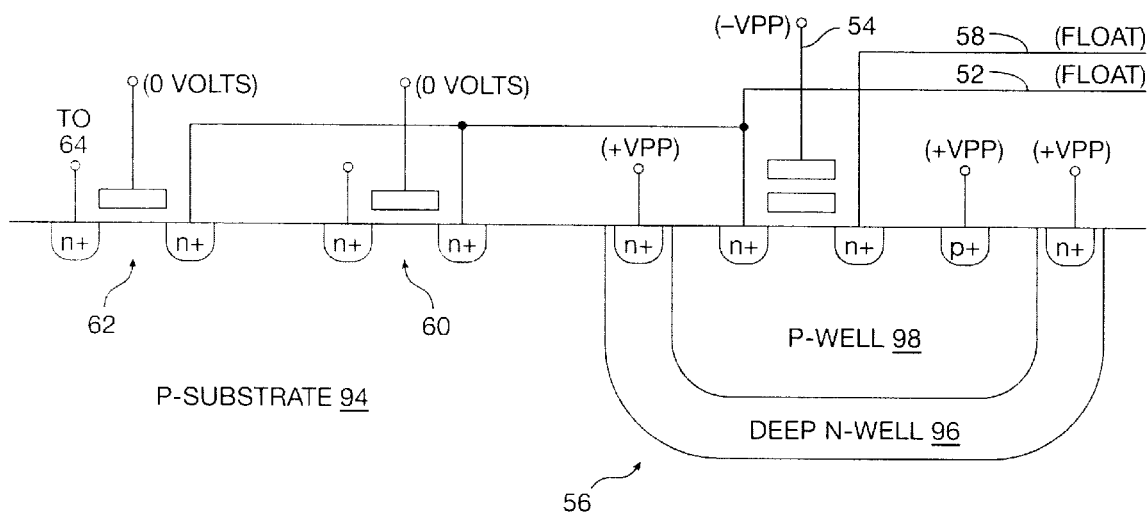
FIG. 3 is a cross-sectional view of a portion of the conventional EEPROM of FIG. 1.
Figure 7:
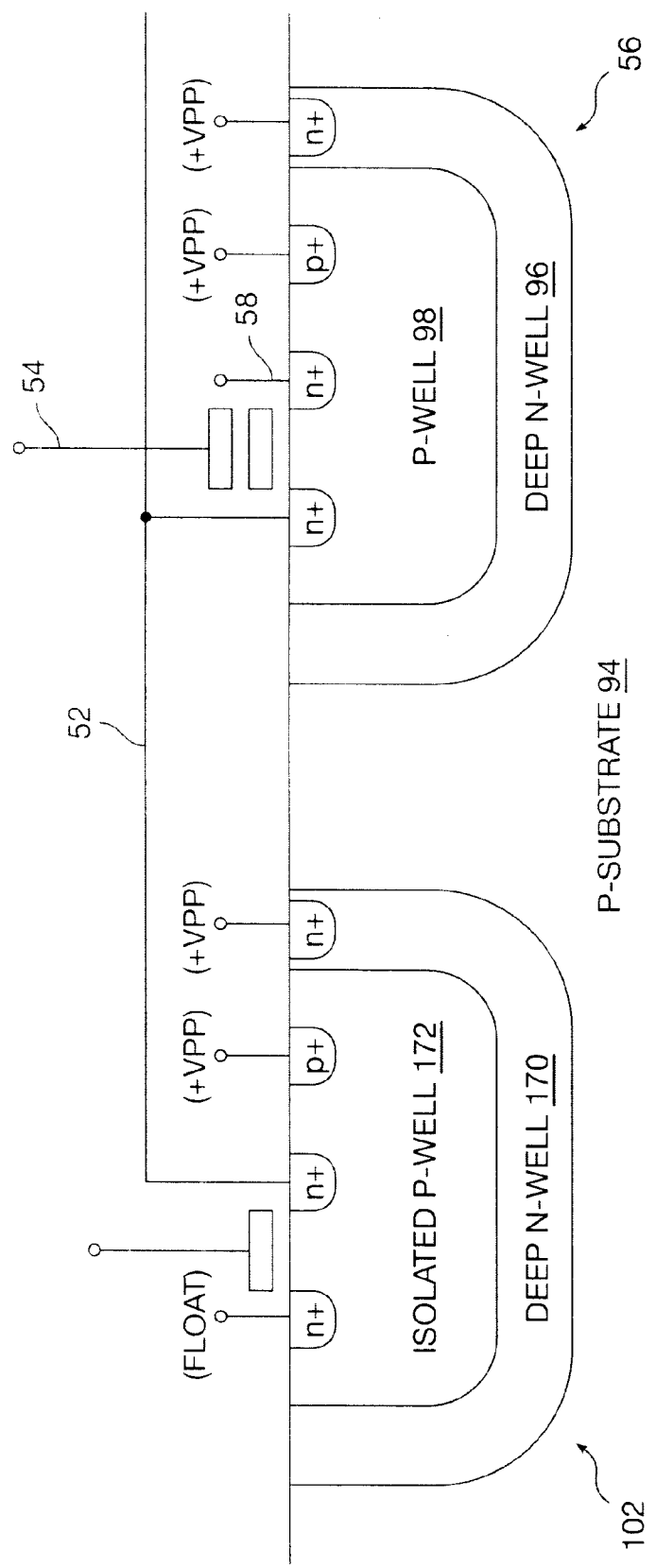
FIG. 7 is a cross-sectional view of a portion of the EEPROM of FIG. 4 according to yet another embodiment of the present invention.

FIG. 7 is a cross-sectional view of a portion of EEPROM 100 (see FIG. 4) according to yet another embodiment of the present invention. The cell transistor 56 is similar to that of FIG. 3, and similar features from that figure are not further discussed. Important differences include the addition of a deep N-well 170 and an isolated P-well 172 to the bit line discharging transistor 102 (as compared to the bit line discharging transistor 60 of FIG. 3). The deep N-well 170 and the isolated P-well 172 may also be added to the bit line selection transistors 104 and to the selection transistors 106. During an erasure operation, isolated P-well 172 may be charged to a level of +VPP (e.g., about 10 volts). The bit line 52 and source of the bit line discharging transistor 102 may be charged to a potential level of about 9.5 volts (i.e., VPP less a diode drop). Under customary configurations, with the gate at 0 volts, a relatively high voltage of about 9.5 volts is presented to the gate oxide of the transistor 102 (or 104 or 106), necessitating the use of high-voltage transistors with a thicker gate oxide.

However, if the gate of the bit line discharging transistor 102 is floated, the gate will have a positive voltage (e.g., between about 2 and 4 volts) due to the oxide coupling of the source-drain overlap gate oxide under the gate poly region. This reduces the potential difference between the gate and the source or drain. Similarly, if the gate of the bit line discharging transistor 102 is given a positive bias voltage (e.g., between about 3 and 5 volts), the potential difference between the gate and the source or drain will be reduced. In either case, this allows transistors with a thinner gate oxide to be used, easing the design constraints for fitting the transistors 102 (or 104 or 106) within the bit lines pitch.

Although the preceding description has focused on several preferred embodiments, the invention is not intended to be limited solely thereto, but instead to the appended claims and their equivalents.

What is claimed is:

1. An electrically-erasable, programmable read-only memory, comprising:
    a plurality of bit lines;
    a plurality of source lines;
    a plurality of cell transistors coupling the bit lines and the source lines;
    a plurality of bit line discharge transistors coupled to selectively discharge said plurality of bit lines;
    a plurality of bit line selection transistors coupled to select said plurality of bit lines;
    a plurality of column decoder circuits coupled to selectively decode values stored by said plurality of cell transistors, wherein said plurality of column decoder circuits is further coupled to provide, during an erasure operation, a bias voltage to at least one of said plurality of bit line discharge transistors and of said plurality of bit line selection transistors; and
    a short-prevention circuit coupled to prevent a short from said plurality of bit lines to ground during said erasure operation.

2. The electrically-erasable, programmable read-only memory of claim 1, wherein each of said plurality of column decoder circuits comprises a plurality of transistors coupled to provide said bias voltage in accordance with an erase signal.

3. The electrically-erasable, programmable read-only memory of claim 1, wherein said bias voltage is provided to a plurality of gates of said plurality of bit line discharge transistors and of said plurality of bit line selection transistors.

4. The electrically-erasable, programmable read-only memory of claim 1, wherein said bias voltage is a positive voltage approximately half that of an erasure voltage.

5. The electrically-erasable, programmable read-only memory of claim 4, wherein said erasure voltage is approximately 10 volts and said bias voltage is between 3 and 5 volts.

6. The electrically-erasable, programmable read-only memory of claim 1, wherein said bias voltage is greater than a zero voltage.

7. The electrically-erasable, programmable read-only memory of claim 1, wherein said plurality of bit line discharge transistors have a thin gate oxide.

8. The electrically-erasable, programmable read-only memory of claim 1, wherein said plurality of bit line selection transistors have a thin gate oxide.

9. An electrically-erasable, programmable read-only memory, comprising:

a plurality of bit lines;

a plurality of source lines;

a plurality of cell transistors coupling the bit lines and the source lines;

a plurality of bit line discharge transistors coupled to selectively discharge said plurality of bit lines;

a plurality of bit line selection transistors coupled to select said plurality of bit lines;

a plurality of column decoder circuits coupled to selectively decode values stored by said plurality of cell transistors, wherein said plurality of column decoder circuits is further coupled to float, during an erasure operation, at least one of said plurality of bit line discharge transistors and of said plurality of bit line selection transistors; and a short-prevention circuit coupled to prevent a short from said plurality of bit lines to ground during said erasure operation.

10. The electrically-erasable, programmable read-only memory of claim 9, wherein each of said plurality of column decoder circuits comprises a plurality of transistors coupled to provide said float in accordance with an erase signal.

11. The electrically-erasable, programmable read-only memory of claim 9, wherein said float is provided to a plurality of gates of said plurality of bit line discharge transistors and of said plurality of bit line selection transistors.

12. The electrically-erasable, programmable read-only memory of claim 9, wherein a float voltage provided by said plurality of column decoder circuits is greater than a zero voltage.

13. The electrically-erasable, programmable read-only memory of claim 9, wherein said plurality of bit line discharge transistors have a thin gate oxide.

14. The electrically-erasable, programmable read-only memory of claim 9, wherein said plurality of bit line selection transistors have a thin gate oxide.

* * * * *